(12) United States Patent
Kinouchi et al.

(10) Patent No.: US 8,906,175 B2
(45) Date of Patent: Dec. 9, 2014

(54) ROOM TEMPERATURE BONDING APPARATUS

(75) Inventors: Masato Kinouchi, Kanagawa (JP);
Takayuki Goto, Kanagawa (JP); Satoshi Tawara, Nagasaki (JP); Takeshi Tsuno, Kanagawa (JP); Jun Utsumi, Kanagawa (JP); Kensuke Ide, Shiga (JP); Takenori Suzuki, Shiga (JP)

(73) Assignee: Mitsubishi Heavy Industries, Ltd., Tokyo (JP)

( * ) Notice: Subject to any disclaimer, the term of this patent is extended or adjusted under 35 U.S.C. 154(b) by 27 days.

(21) Appl. No.: 13/139,085

(22) PCT Filed: Sep. 29, 2009

(86) PCT No.: PCT/JP2009/066990
§ 371 (c)(1),
(2), (4) Date: Jul. 29, 2011

(87) PCT Pub. No.: WO2010/067656
PCT Pub. Date: Jun. 17, 2010

(65) Prior Publication Data
US 2011/0277904 A1   Nov. 17, 2011

(30) Foreign Application Priority Data

Dec. 11, 2008   (JP) ................. 2008-315431

(51) Int. Cl.
| | |
|---|---|
| B29C 65/00 | (2006.01) |
| B31B 1/60 | (2006.01) |
| B32B 37/00 | (2006.01) |
| H01L 21/67 | (2006.01) |
| H01L 21/683 | (2006.01) |
| B23K 20/02 | (2006.01) |

(52) U.S. Cl.
CPC ...... H01L 21/6838 (2013.01); H01L 21/67201 (2013.01); B23K 20/02 (2013.01); B23K 2201/40 (2013.01)
USPC .............. 156/60; 156/382; 156/285; 156/286

(58) Field of Classification Search
USPC ................... 156/60, 285, 286, 382
See application file for complete search history.

(56) References Cited

U.S. PATENT DOCUMENTS

2003/0168145 A1* 9/2003 Suga et al. .......... 156/60
2007/0002516 A1   1/2007 Matsumoto
(Continued)

FOREIGN PATENT DOCUMENTS

| JP | 4-282848 A | 10/1992 |
|---|---|---|
| JP | 7-201948 A | 8/1995 |

(Continued)

OTHER PUBLICATIONS

Kinouchi, Masahito. Normal-Temperature Bonding Apparatus. Publication date: Oct. 11, 2007. JP 2007-266058. Detailed Description.*

(Continued)

Primary Examiner — Richard Crispino
Assistant Examiner — Matthew Hoover
(74) Attorney, Agent, or Firm — Birch, Stewart, Kolasch & Birch, LLP

(57) ABSTRACT

A room temperature bonding apparatus according to the present invention is provided with a load lock chamber having an internal space which is pressure-reduced; and a cartridge arranged in the load lock chamber. The cartridge includes an island portion formed to contact a substrate when the substrate is put on the cartridge. A flow passage is formed for the island portion to connect a space between the cartridge and the substrate to outside when the substrate is put on the cartridge. Therefore, in the room temperature bonding apparatus can prevent making the substrate is moved to the cartridge due to gas when the internal space is pressure-reduced.

11 Claims, 11 Drawing Sheets

(56) References Cited

U.S. PATENT DOCUMENTS

| | | | |
|---|---|---|---|
| 2007/0051462 A1* | 3/2007 | Nakayama et al. ........... | 156/285 |
| 2007/0284282 A1 | 12/2007 | Yajima et al. | |
| 2008/0073562 A1 | 3/2008 | Suzuki | |

FOREIGN PATENT DOCUMENTS

| | | |
|---|---|---|
| JP | 11-329983 A | 11/1999 |
| JP | 2004-207606 A | 7/2004 |
| JP | 2005-142537 A | 6/2005 |
| JP | 2006-66417 A | 3/2006 |
| JP | 2007-12942 A | 1/2007 |
| JP | 3970304 B1 | 9/2007 |
| JP | 2007-265971 A | 10/2007 |
| JP | 2007-266058 A | 10/2007 |
| JP | 2007-329238 A | 12/2007 |
| JP | 2008-235460 A | 10/2008 |

OTHER PUBLICATIONS

Kinouchi, Masahito. Normal-Temperature Bonding Apparatus. Publication date: Oct. 11, 2007. JP 2007-266058. Drawings.*

Oguchi, Masamitsu. "Method for Forming Film by CVD and Device Therefor." Publication date Nov. 30, 1999. JP 11-329983. Detailed Description.*

Oguchi, Masamitsu. "Method for Forming Film by CVD and Device Therefor." Publication date Nov. 30, 2099. JP 11-329983. Drawings.*

Japanese Office Action mailed Apr. 28, 2011 and English translation of the relevant portion.

Taiwanese Office Action for Taiwanese Application No. 098133318 mailed Oct. 3, 2013, with English translation.

Canadian Notice of Allowance, dated Sep. 23, 2014, for Canadian Application No. 2,746,035.

Chinese Notification of the Decision to Grant a Patent, dated Sep. 3, 2014, for Chinese Application No. 200980149748.5, with English translation.

* cited by examiner

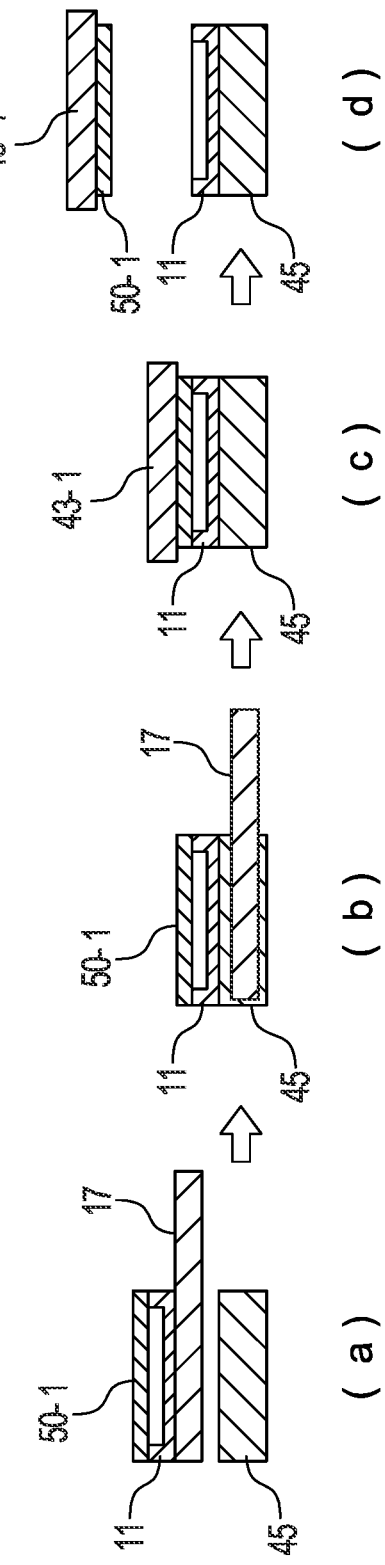

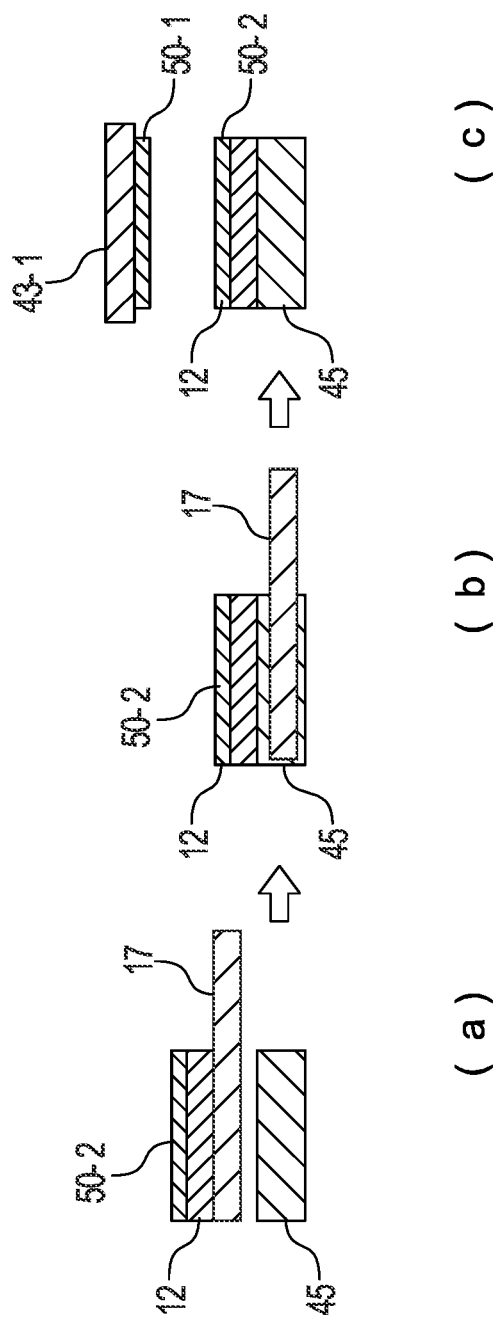

ROOM TEMPERATURE BONDING APPARATUS

BACKGROUND OF THE INVENTION

1. Field of the Invention

The present invention relates to a room temperature bonding apparatus, and especially to a room temperature bonding apparatus which performs mass-production of a product by using room temperature bonding.

2. Description of the Related Art

MEMS is known in which electric parts and mechanical parts are integrated. As the MEMS, a micro-relay, a pressure sensor, an acceleration sensor, and so on are exemplified. The room temperature bonding is known in which surfaces of two wafers activated in a vacuumed atmosphere are brought into contact with each other to join the two wafers. Such a room temperature bonding is preferable to produce the MEMS. In such a room temperature bonding, it is important to prevent pollution of the bonding surfaces of the wafers. Moreover, such a room temperature bonding apparatus is necessary to address improvement of mass productivity and improvement of reliability, and cost reduction, compact size, reducing of maintenance work are required.

The room temperature bonding apparatus of a long life is disclosed in Japanese patent No. 3,970,304. The room temperature bonding apparatus is provided with a bonding chamber, an upper-side stage, the carriage, an elastic guide, a positioning stage, a first mechanism, a second mechanism and a carriage support stage. The bonding chamber is set to vacuum atmosphere to join an upper-side substrate and a lower-side substrate in the room temperature. The upper-side stage is installed in the internal space of the bonding chamber and supports the upper-side substrate in the vacuum atmosphere. The carriage is installed in the internal space of the bonding chamber and supports the lower-side substrate in the vacuum atmosphere. The elastic guide is joined to the carriage to form a unitary body. The positioning stage is installed in the internal space of the bonding chamber and supports the elastic guide to be movable in a horizontal direction. The first mechanism drives the elastic guide and moves the carriage in the horizontal direction. The second moves the upper-side stage in up and down directions perpendicular to the horizontal direction. The carriage support stage is installed in the internal space of the bonding chamber and supports the carriage in a direction of movement of the upper-side stage when the lower-side substrate and the upper-side substrate are subjected to pressure welding. The elastic guide supports the carriage so that the carriage does not contact the carriage support stage when the lower-side substrate and the upper-side substrate are not brought into contact. The elastic guide elastically deforms so that the carriage contacts the carriage support stage when the lower-side substrate and the upper-side substrate are subject to the pressure welding.

A wafer support plate which makes the treatment of a semiconductor wafer easy and allows a crystal orientation to be recognized is disclosed in Japanese Patent Publication (JP 2004-207606A). The wafer support plate is a wafer support plate having a support surface to support the semiconductor wafer and a crystal orientation mark by which the crystal orientation of the supported semiconductor wafer is shown.

CITATION LIST

[Patent Literature 1]: Japanese Patent No. 3970304
[Patent Literature 2]: JP 2004-207606A

SUMMARY OF THE INVENTION

An object of the present invention is to provide a room temperature bonding apparatus which can prevent misalignment of substrates to be joined.

Another object of the present invention is to provide a room temperature bonding apparatus which can prevent pollution of substrates to be joined.

Another object of the present invention is to provide a room temperature bonding apparatus which can prevent pollution of atmosphere in which substrates are joined.

Another object of the present invention is to provide a room temperature bonding apparatus whose manufacturing cost is cheap.

Another object of the present invention is to provide a room temperature bonding apparatus, maintenance for which is made easy.

Another object of the present invention is to provide a room temperature bonding apparatus which can prevent a damage of substrates to be joined.

Another object of the present invention is to provide a room temperature bonding apparatus which is suitable to convey and join thinner substrates.

Another object of the present invention is to provide a room temperature bonding apparatus which is suitable to convey and join substrates of various shapes.

A room temperature bonding apparatus according to the present invention is provided with a load lock chamber having an internal space which is pressure-reduced, and a cartridge arranged in the load lock chamber. At this time, the cartridge includes an island portion formed to contact a substrate when the substrate is put on the cartridge. A flow passage is formed for the island portion to connect a space between the cartridge and the substrate to outside when the substrate is put on the cartridge. A gas filled in a space between the cartridge and the substrate is exhausted outside through the flow passage when the internal space of the load lock chamber is pressure-reduced. Therefore, in the room temperature bonding apparatus the substrate can be prevented from moving to the cartridge due to the gas when the internal space is pressure-reduced.

The room temperature bonding apparatus according to the present invention includes a bonding chamber, a gate valve configured to open and close a gate between said load lock chamber and said bonding chamber; and a conveyer unit configured to convey the cartridge from the load lock chamber to the bonding chamber when the gate is open. At this time, the bonding chamber bonds the substrate with another substrate when the substrate is arranged in the internal space of the bonding chamber. It is desirable that the cartridge is applied to the room temperature bonding apparatus.

A flange is provided for the cartridge. At this time, the conveyer unit holds the cartridge by supporting a lower surface of the flange. Such a room temperature bonding apparatus can hold the substrate by the conveyer unit more surely without directly contacting the substrate. Therefore, such a room temperature bonding apparatus can prevent pollution of the substrate.

The flange of the cartridge has a hand positioning section. At this time, the conveyer unit includes another hand positioning section configured to engage with the hand positioning section when the cartridge is conveyed. In the room temperature bonding apparatus, the conveyer unit can hold the cartridge such that the cartridge is always set to a same position to the conveyer unit. Therefore, the room temperature bonding apparatus can convey the substrate in a higher accuracy. The hand positioning section is a pin. It is desirable that the other hand positioning section is a notch.

The bonding chamber is provided with a lower-side stage configured to hold the cartridge. At this time, the cartridge comprises a stage positioning section. The lower-side stage includes another stage positioning section configured to engage the stage positioning section when the lower-side stage holds the cartridge. In such a room temperature bonding apparatus, the lower-side stage can hold the cartridge such that the cartridge is always positioned to a same position to the lower-side stage. Therefore, such a room temperature bonding apparatus can bond the substrates in a higher accuracy.

The stage positioning section is a hole. It is desirable that the other stage positioning section is a prominence engages with the hole.

The room temperature bonding apparatus according to the present invention is further provided with an imaging unit and an alignment unit. At this time, the imaging unit takes an image of the substrate through the alignment hole when the lower-side stage holds the cartridge in a state that the substrate is put on the cartridge. The alignment unit drives the lower-side stage based on the image. Such a room temperature bonding apparatus can position the substrate in a high accuracy in a state that the substrate is put on the cartridge. Therefore, such a room temperature bonding apparatus can bond the substrate in a high accuracy in a state that the substrate is put on the cartridge.

The island portion is formed to contact a substantially whole of one of surfaces of the substrate. At this time, a ditch as the flow passage is formed in the contact surface. In such a room temperature bonding apparatus, the damage of the substrate can be prevented when the substrate is bonded in a state that the substrate is put on the cartridge and a large load can be applied to the substrate.

The cartridge is provided with a plurality of substrate positioning pins. At this time, the plurality of substrate positioning pins are arranged such that the outer circumferential edge of the substrate contacts all of the plurality of substrate positioning pins when the substrate is put on the cartridge. Such a room temperature bonding apparatus, the substrate can be always put on the cartridge in a same position to the cartridge. Therefore, such a room temperature bonding apparatus can convey the substrate in a high accuracy.

The plurality of substrate positioning pins have heights between a back surface of the substrate when the substrate contacts the cartridge, and a front surface opposite to the back surface, such that the plurality of substrate positioning pins do not protrude upwardly from the front surface, when the substrate is put on the cartridge. In such a room temperature bonding apparatus, it is possible to prevent the upper-side stage from contacting the plurality of substrate positioning pins when the upper-side stage is moved closer to the substrate and it is possible to surely bring the substrate into contact with the upper-side stage. In such a room temperature bonding apparatus, when the substrate is bonded with another substrate, it is possible to prevent the plurality of substrate positioning pins from obstructing the bonding and the substrate can be bonded more surely.

The island portion contacts a peripheral section of one of surfaces of said substrate not a central section thereof. When two substrates are bonded, such a cartridge is used to mount one of the substrates held by the upper-side stage as the upper-side substrate. At this time, such a room temperature bonding apparatus can prevent the pollution of the bonding surface of the upper-side substrate.

A room temperature bonding method of the present invention, is achieved by pressure-reducing an internal space of a load lock chamber in which a cartridge on which a substrate is put is arranged; and by conveying the cartridge from the internal space of the load lock chamber into an internal space of a bonding chamber after the internal space of the load lock chamber is pressure-reduced. The cartridge includes an island portion to contact the substrate when the substrate is put on the cartridge. A flow passage is formed for the island portion to connect the space between the cartridge and the substrate when the substrate is put to the outside. The gas filled into the space between the cartridge and the substrate is exhausted outside through the flow passage when the internal space of the load lock chamber is pressure-reduced. Therefore, it is possible to prevent the substrate from being moved to the cartridge due to the gas when the internal space is pressure-reduced, according to such a room temperature bonding method.

The bonding chamber includes an upper-side stage and a lower-side stage, and the substrate is an upper-side substrate and a lower-side substrate. At this time, the room temperature bonding method includes holding the upper-side substrate by the upper-side stage by moving the upper-side stage closer to the lower-side stage approach when the upper-side substrate is put on the upper-side cartridge and the lower-side stage holds the upper-side cartridge; and bonding the upper-side substrate and the lower-side substrate by moving the upper-side stage closer to the lower-side stage when the lower-side substrate is put on the lower-side cartridge and the lower-side stage holds the lower-side cartridge, after the upper-side substrate is held by the upper-side stage. That is, it is desirable that the cartridge is applied to such a room temperature bonding method.

The room temperature bonding apparatus of the present invention can prevent misalignment of substrates to be joined.

Moreover, the room temperature bonding apparatus of the present invention can convey the substrate without directly contacting the substrate and can prevent pollution of substrates to be joined.

Moreover, the room temperature bonding apparatus of the present invention can prevent pollution of atmosphere in which substrates are joined.

Moreover, in the room temperature bonding apparatus of the present invention, a manufacturing cost is made cheaper.

Moreover, the room temperature bonding apparatus of the present invention, maintenance is made easy.

Moreover, the room temperature bonding apparatus of the present invention can prevent a damage of substrates to be joined.

Moreover, the room temperature bonding apparatus of the present invention is suitable to convey and join thinner substrates.

Moreover, the room temperature bonding apparatus of the present invention is suitable to convey and join substrates of various shapes.

BRIEF DESCRIPTION OF THE DRAWINGS

FIG. 12 is a diagram showing an operation to convey the upper-side wafer; and

FIG. 13 is a diagram showing an operation to convey the lower-side wafer.

DETAILED DESCRIPTION OF THE INVENTION

Figure 1:
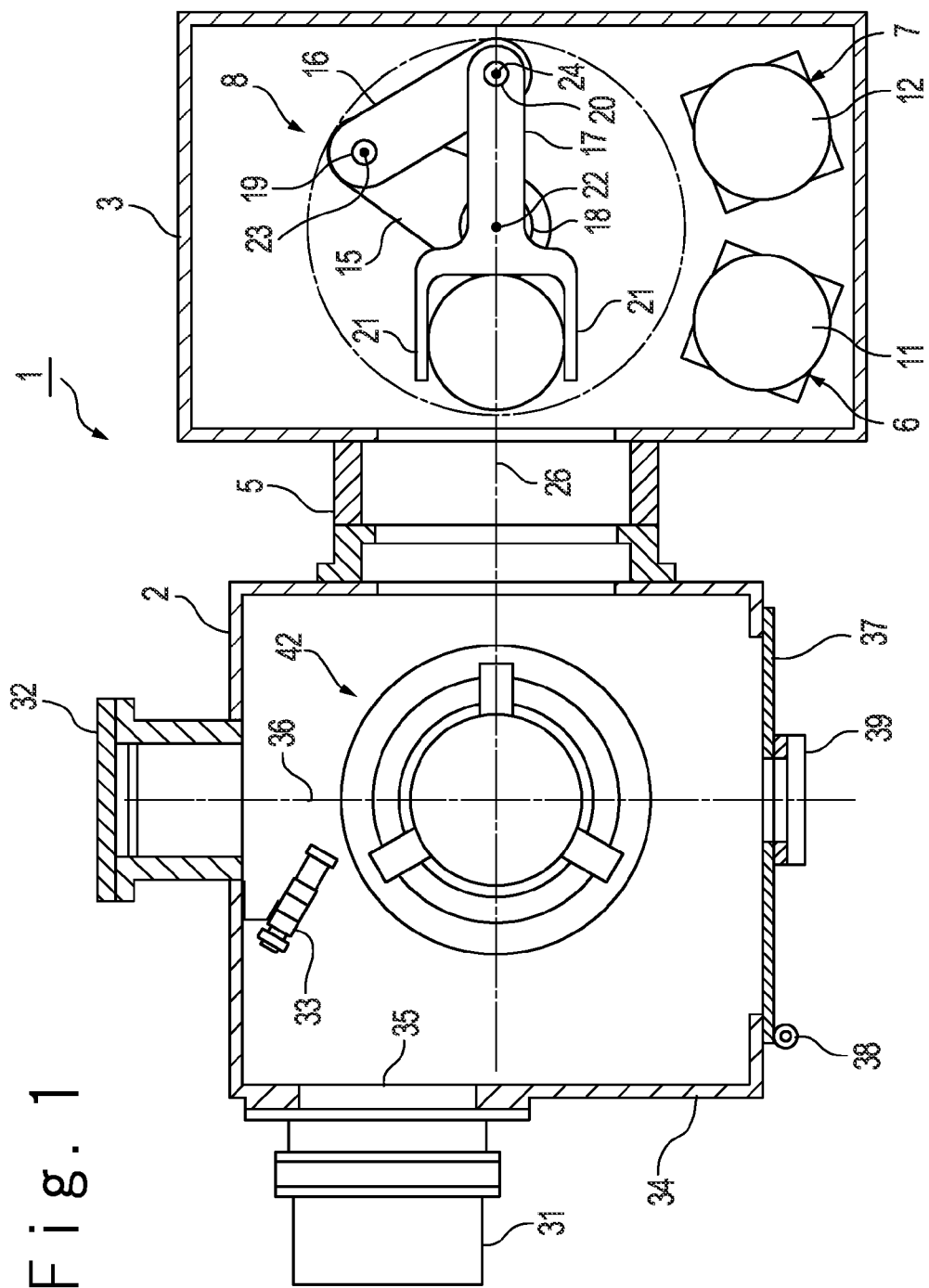
FIG. 1 is a horizontal sectional view showing a room temperature bonding apparatus.

Hereinafter, a room temperature bonding apparatus according to an embodiment of the present invention will be described with reference to the attached drawings. As shown in FIG. 1, the room temperature bonding apparatus 1 is provided with a bonding chamber 2 and a load lock chamber 3. The bonding chamber 2 and the load lock chamber 3 are containers which shield the internal spaces from external environment, and are generally formed of stainless steel, aluminum alloy and so on. Moreover, the room temperature bonding apparatus 1 is provided with a gate valve 5. The gate valve 5 is interposed between the bonding chamber 2 and the load lock chamber 3 and opens or closes a gate which connects the internal space of the bonding chamber 2 and the internal space of the load lock chamber 3.

The load lock chamber 3 is provided with an upper-side cartridge stage 6, a lower-side cartridge stage 7 and a conveyer unit 8. The upper-side cartridge stage 6 is provided with an upper-side cartridge 11. The lower-side cartridge stage 7 is provided with a lower-side cartridge 12. Moreover, the load lock chamber 3 is provided with a vacuum pump and a lid (both not shown). The gas is exhausted from the internal space of the load lock chamber 3 by the vacuum pump. As the vacuum pump, a turbo-molecular pump is exemplified which exhausts by flicking away gaseous molecules by a plurality of wings which are made of metal. The gate is closed by lid so as to disconnect external atmosphere and the internal space in the load lock chamber 3 and opened so as to set the internal space to atmosphere. The size of the gate is larger than the upper-side cartridge 11 and the lower-side cartridge 12.

The conveyer unit 8 is provided with a first arm 15, a second arm 16, a hand 17, a first joint 18, a second joint 19 and a third joint 20. The first arm 15, the second arm 16 and the hand 17 are formed in stick-shape, respectively. The first joint 18 is supported to a floor of the load lock chamber 3 and supports the first arm 15 to be rotatable around a rotation axis 22. The rotation axis 23 is parallel to the vertical direction. The second joint 19 is supported by the first joint 18 and supports the second arm 16 to be rotatable around a rotation axis 23. The rotation axis 23 is parallel to the vertical direction, i.e. is parallel to the rotation axis 22. The third joint 20 is supported by the second joint 19 and supports the hand 17 to be rotatable around the rotation axis 24. The rotation axis 24 is parallel to the vertical direction, i.e. is parallel to the rotation axis 23.

Moreover, the conveyer unit 8 is provided with an up-and-down moving mechanism and an expanding and contracting mechanism (both not shown). In response to an operation by a user, the up-and-down moving mechanism moves the first arm 15 up and down so that the hand 17 moves up and down. In response to an operation by the user, the expanding and contracting mechanism controls the first joint 18 to rotate the hand 17 and controls the first joint 18, the second joint 19 and the third joint 20 to move the hand 17 in parallel to a longitudinal direction of the hand 17.

The conveyer unit 8 conveys the upper-side cartridge 11 or the lower-side cartridge 12 from the load lock chamber 3 to the bonding chamber 2 through the gate valve 5. In addition, the conveyer unit 8 is used to convey the upper-side cartridge 11 or the lower-side cartridge 12 from the bonding chamber 2 to the load lock chamber 3 through the gate valve 5.

The bonding chamber 2 is provided with a vacuum pump 31, an ion gun 32 and an electron gun 33. An exhaust vent 35 is formed in a part of a wall 34 of the bonding chamber 2. The vacuum pump 31 is arranged outside the bonding chamber 2 and gas is exhausted through the exhaust vent 35 from the internal space of the bonding chamber 2. As the vacuum pump 31, a turbo-molecular pump is exemplified which exhausts by flicking away gaseous molecules by a plurality of wings made of metal. The ion gun 32 is arranged to turn to an irradiation direction 36 and emits accelerated charged particles to the irradiation direction 36. As the charged particles, argon ions are exemplified. The ion gun 32 may be substituted by another surface activating unit which activates the surface of a wafer to be bonded. As the surface activating unit, a plasma gun, a high-speed atom beam source and so on are exemplified. The electron gun 33 is arranged to turn to an object to be irradiated with the charged particles from the ion gun 32 and emits accelerated electrons to the object.

A door 37 is formed in a part of the wall 34. The door 37 is provided with a hinge 38. The hinge 38 supports the door 37 rotatably to the wall 34.

Moreover, a window 39 is formed in a part of the door 37. The window 39 is formed of a material which transmits visible light without transmit gaseous molecules. The window 39 may be disposed anywhere on the wall 34 if the window 39 is arranged such that the user can see the object or a bonding state from outside the bonding chamber 2 and charged particles are irradiated from the ion gun 32.

Figure 2:
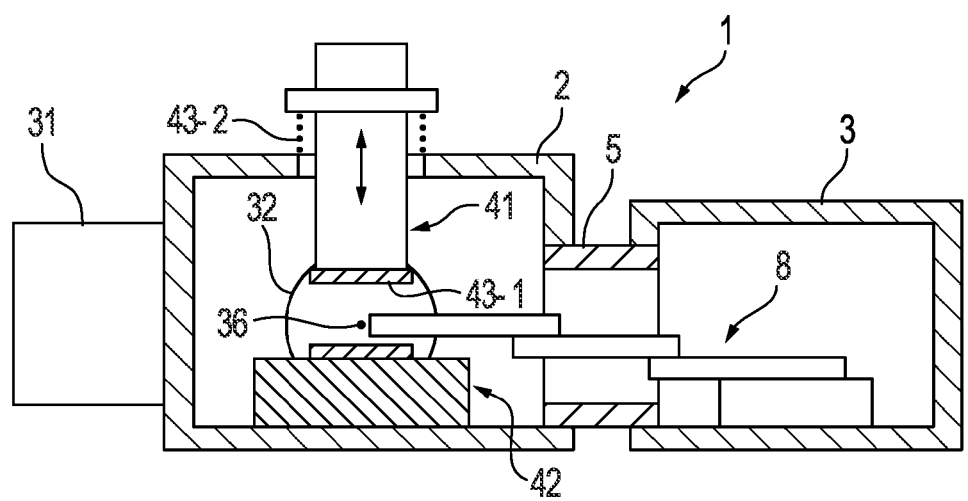
FIG. 2 is a vertical sectional view showing the room temperature bonding apparatus.

As shown in FIG. 2, the bonding chamber 2 is provided with an upper-side stage 41 and a lower-side stage 42 therein. The lower-side stage 42 is arranged in a lower portion of the bonding chamber 2. The upper-side stage 41 is arranged in an upper portion of the bonding chamber 2 and is provided with a sample stage 43-1 and a pressure welding mechanism 43-2. The sample stage 43-1 is supported to be movable in the vertical direction to the bonding chamber 2. The sample stage 43-1 is provided with a dielectric layer in a lower end, and a voltage is applied between the dielectric layer and the wafer to adsorb the wafer to the dielectric layer with electrostatic force. The pressure welding mechanism 43-2 moves the sample stage 43-1 in the vertical direction to the bonding chamber 2 in response to an operation by the user.

When the substrate supported on the upper-side stage 41 and the substrate supported on the lower-side stage 42 are apart from each other, the ion gun 32 is turned to a space between the substrate supported on the upper-side stage 41 and the substrate supported on the lower-side stage 42. That is, the irradiation direction 36 of the ion gun 32 passes through the space between the substrate supported on the upper-side stage 41 and the substrate supported on the lower-side stage 42 and intersects the inner surface of the bonding chamber 2.

Figure 3:
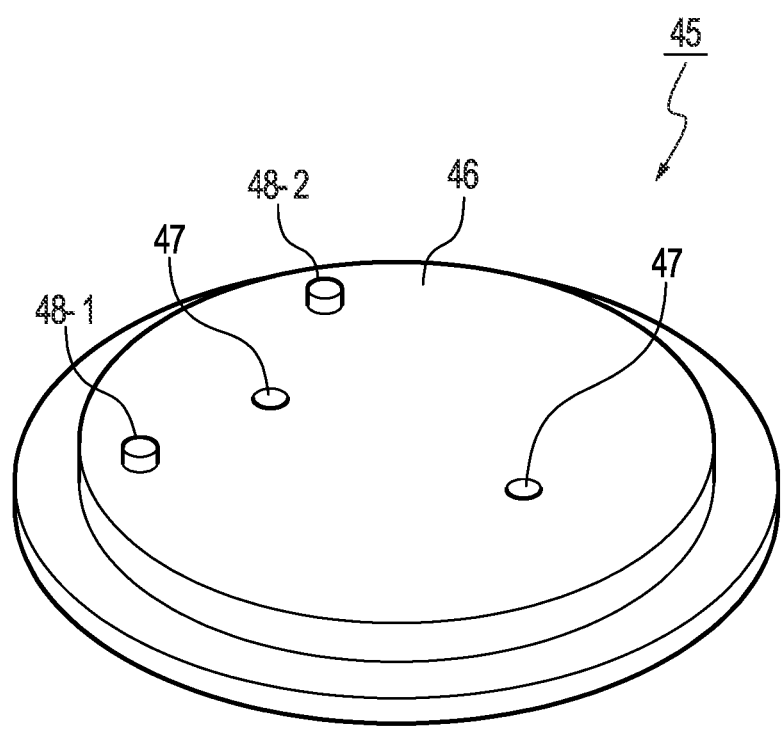
FIG. 3 is a perspective view showing a stage carriage.

As shown in FIG. 3, the lower-side stage 42 is provided with a stage carriage 45. The stage carriage 45 is formed to substantially have a disk shape. The stage carriage 45 is arranged for a central axis of the disk to be parallel to the vertical direction, and a flat support surface 46 is formed on the upper-side of the disk. A plurality of alignment holes 47 are formed in the support surface 46 of the stage carriage 45.

Moreover, in the stage carriage 45, a plurality of positioning pins 48-1 and 48-2 are formed in the peripheral section of the support surface 46. The plurality of positioning pins 48-1 and 48-2 are formed to have circular and tapered prominence shapes.

Moreover, the lower-side stage 42 is provided with two imaging units (not shown) and a positioning mechanism. The imaging units are arranged directly below the stage carriage 45. The imaging units take images of the substrate supported on the lower-side stage 42 through the plurality of alignment holes 47 of the stage carriage 45 in response to an operation by the user. The positioning mechanism moves the stage carriage 45 in a horizontal direction and rotates the stage carriage 45 around a rotation axis parallel to the vertical direction in response to an operation by the user.

Figure 4:
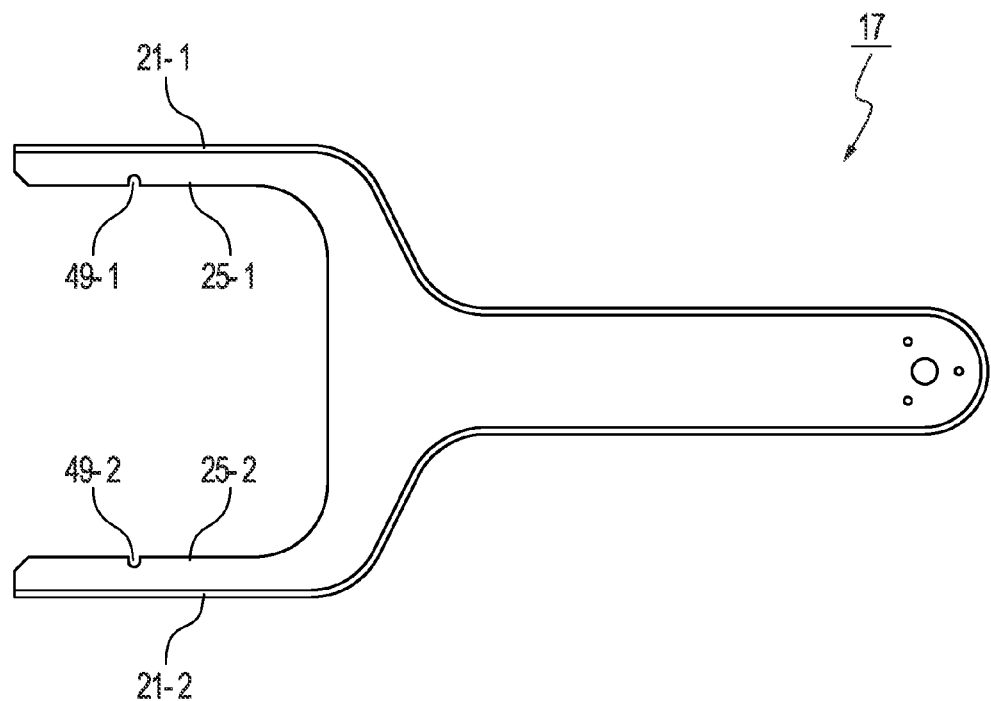
FIG. 4 is a plan view showing a hand of a conveyer unit.

FIG. 4 shows the hand 17 of the conveyer unit 8. The hand 17 has nails 21-1 and 21-2 formed in an end opposite to an end joined with the third joint 20. The nails 21-1 and 21-2 are formed in a plate. The nails 21-1 and 21-2 extend along a horizontal plane. The nail 21-1 has a linear side edge 25-1. The nail 21-2 has a linear side edge 25-2. The nails 21-1 and 21-2 are arranged so that the side edge 25-1 and the side edge 25-2 oppose to each other and the side edge 25-1 and the side edge 25-2 are parallel. In the nail 21-1, a notch 49-1 is formed in a part of the side edge 25-1. In the nail 21-2, a notch 49-2 is formed in a part of the side edge 25-2. The notch 49-2 is formed to be opposite to the notch 49-1.

Figure 5:
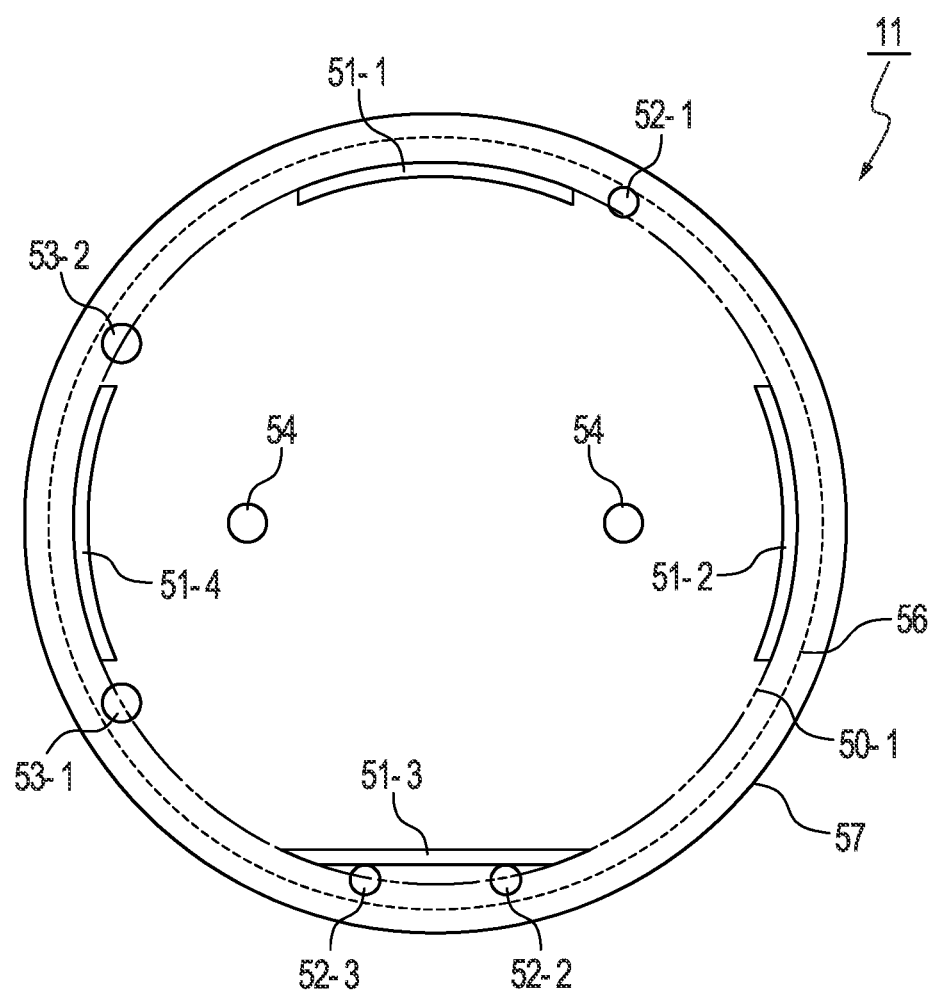
FIG. 5 is a plan view showing an upper-side cartridge.

FIG. 5 shows the upper-side cartridge 11. The upper-side cartridge 11 is formed of aluminum or stainless steel, and is formed to substantially have a disk shape and is the upper-side wafer is mounted thereon. In the upper-side cartridge 11, a plurality of positioning holes 53-1 and 53-2 and a plurality of alignment holes 54 are formed. The plurality of positioning holes 53-1 and 53-2 are formed to have a circular shape and are formed in the neighborhood of the periphery of the disk. The diameter of the plurality of positioning holes 53-1 and 53-2 is substantially equal to the diameter of the positioning pins 48-1 and 48-2 of the stage carriage 45. Moreover, the plurality of positioning holes 53-1 and 53-2 are formed so that a distance between the positioning hole 53-1 and the positioning hole 53-2 is equal to a distance between the positioning pin 48-1 and the positioning pin 48-2. That is, the plurality of positioning holes 53-1 and 53-2 are arranged to fit with the plurality of positioning pins 48-1 and 48-2 when the upper-side cartridge 11 is put on the stage carriage 45. That is, the upper-side cartridge 11 is put on the stage carriage 45 when the upper-side cartridge 11 is arranged on the stage carriage 45 so that the plurality of positioning pins 48-1 and 48-2 are fit with the plurality of positioning holes 53-1 and 53-2.

The plurality of alignment holes 54 are formed to penetrate. The plurality of alignment holes 54 are formed to be connected with the plurality of alignment holes 47 of the stage carriage 45 when the upper-side cartridge 11 is put on the stage carriage 45. Moreover, the plurality of alignment holes 54 are formed to be coincident with an alignment mark which is formed by the upper-side wafer when the upper-side wafer is put on the upper-side cartridge 11. The two imaging units of the lower-side stage 42 are arranged to be able to image the alignment mark through the plurality of alignment holes 54 when the upper-side cartridge 11 is put on the stage carriage 45.

Moreover, in the upper-side cartridge 11, a plurality of island portions 51-1 to 51-4 and a plurality of wafer positioning pins 52-1 to 52-3 are formed on the upper-side surface of the disk. The plurality of island portions 51-1 to 51-4 are formed as prominences which protrude from the upper-side surface of the disk and are formed so as to be arranged along the outer circumferential edge of the upper-side wafer put on the upper-side cartridge 11. The plurality of wafer positioning pins 52-1 to 52-3 are formed as prominences which protrude from the upper-side surface of the disk and are formed so as to be arranged along the outer circumferential edge periphery of the upper-side wafer put on the upper-side cartridge 11. The wafer positioning pins 52-2 and 52-3 are formed so as to be arranged along the orientation flat of the upper-side wafer put on the upper-side cartridge 11. At this time, the upper-side wafer is arranged on a predetermined position of the upper-side cartridge 11 by putting on the upper-side cartridge 11, so that the orientation flat is brought into contact with the wafer positioning pin 52-1 and the outer circumferential edge is brought into contact with the wafer positioning pin 52-2 and 52-3. Moreover, in the upper-side cartridge 11, the plurality of island portions 51-1 to 51-4 are formed so that a space formed between the upper-side cartridge 11 and the upper-side wafer 50-1 functions as a flow passage communicated with the outside of the upper-side cartridge 11 when the upper-side wafer is arranged on the predetermined position. That is, the plurality of island portions 51-1 to 51-4 are formed to be discontinuous.

Figure 6:
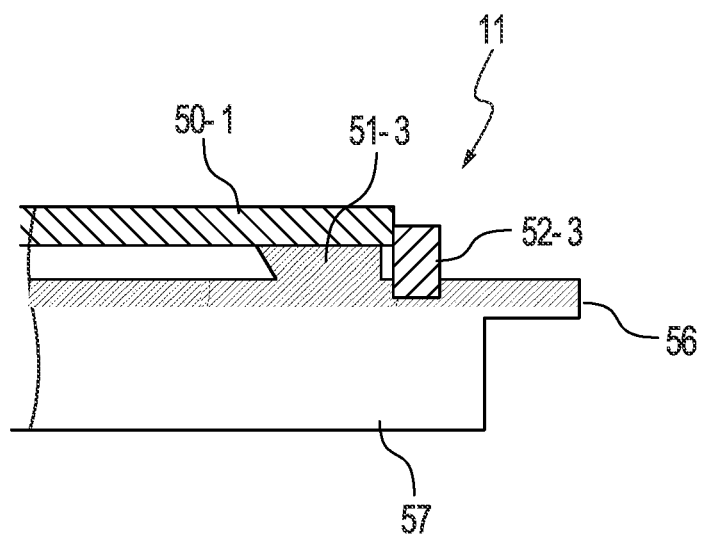
FIG. 6 is a vertical sectional view showing the upper-side cartridge.

Moreover, the plurality of wafer positioning pins 52-1 to 52-3 are formed to be taller than the plurality of island portions 51-1 to 51-4, and are formed to be lower than the upper surface of the upper-side wafer 50-1 arranged on the plurality of island portions 51-1 to 51-4. That is, as shown in FIG. 6, the plurality of island portions 51-1 to 51-4 are formed to contact the periphery portion of the surface of the upper-side wafer 50-1 which is opposite to the upper-side cartridge 11 when the upper-side wafer 50-1 is arranged on the upper-side cartridge 11. The plurality of wafer positioning pins 52-1 to 52-3 are formed to contact the side surface of the upper-side wafer 50-1 when the upper-side wafer 50-1 is arranged on the upper-side cartridge 11. The plurality of wafer positioning pins 52-1 to 52-3 are formed not to protrude from the upper surface of the upper-side wafer 50-1 when the upper-side wafer 50-1 is arranged on the upper-side cartridge 11.

Figure 7:
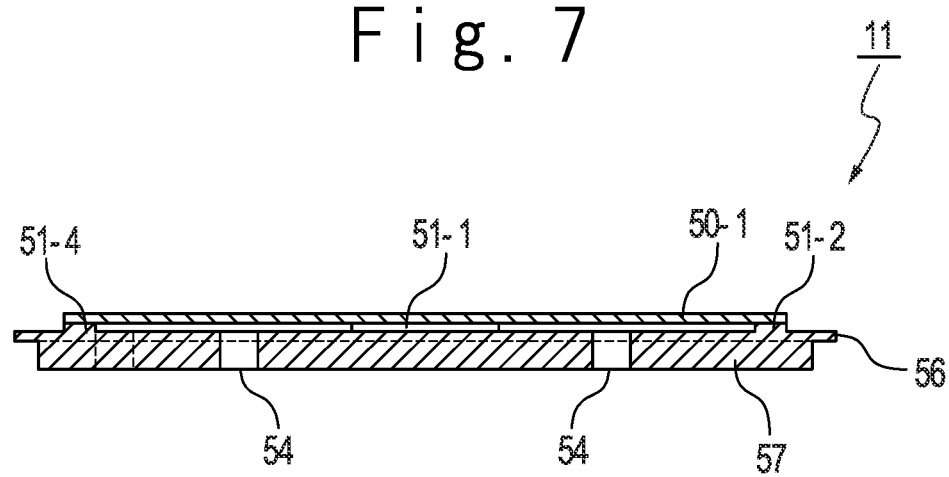
FIG. 7 is a vertical sectional view showing a wafer positioning pin.

As shown in FIG. 7, the upper-side cartridge 11 is formed from a flange section 56 and a body section 57. The body section 57 is formed in a column. The diameter of the column is smaller than a distance between the side edge 25-1 and the side edge 25-2 in the hand 17. The flange section 56 is formed to extend from the side surface of the column of the body section 57 and is formed in a disk. The diameter of the disk is larger than the distance between the side edge 25-1 and the side edge 25-2 in the hand 17. That is, the flange section 56 is put on the nails 21-1 and 21-2 so that the upper-side cartridge 11 is held by the conveyer unit 8.

Figure 8:
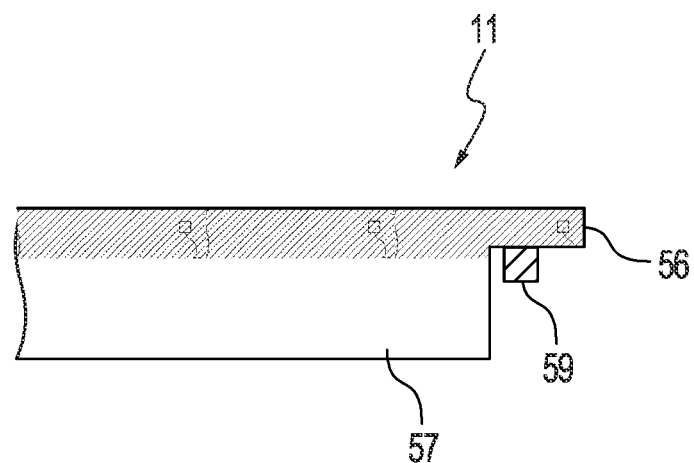
FIG. 8 is a vertical sectional view showing a positioning pin.

Moreover, as shown in FIG. 8, in the upper-side cartridge 11, the positioning pin 59 is formed. The positioning pin 59 is formed as a prominence which protrudes from the lower surface of the flange section 56. The diameter of the positioning pin 59 is substantially equal to the diameter of notches 49-1 and 49-2. Two of the positioning pins 59 are formed on two symmetrical positions with respect to the center of the disk of the flange section 56. That is, the positioning pins 59 are formed to engage with the notches 49-1 and 49-2 of the nail 21-1 and 21-2 when the upper-side cartridge 11 is held by the conveyer unit 8. At this time, when the upper-side cartridge 11 is held by the conveyer unit 8 to engage with the notches 49-1 and 49-2 of the nail 21-1 and 21-2, the upper-side cartridge 11 is held in a predetermined position of the hand 17.

Figure 9:
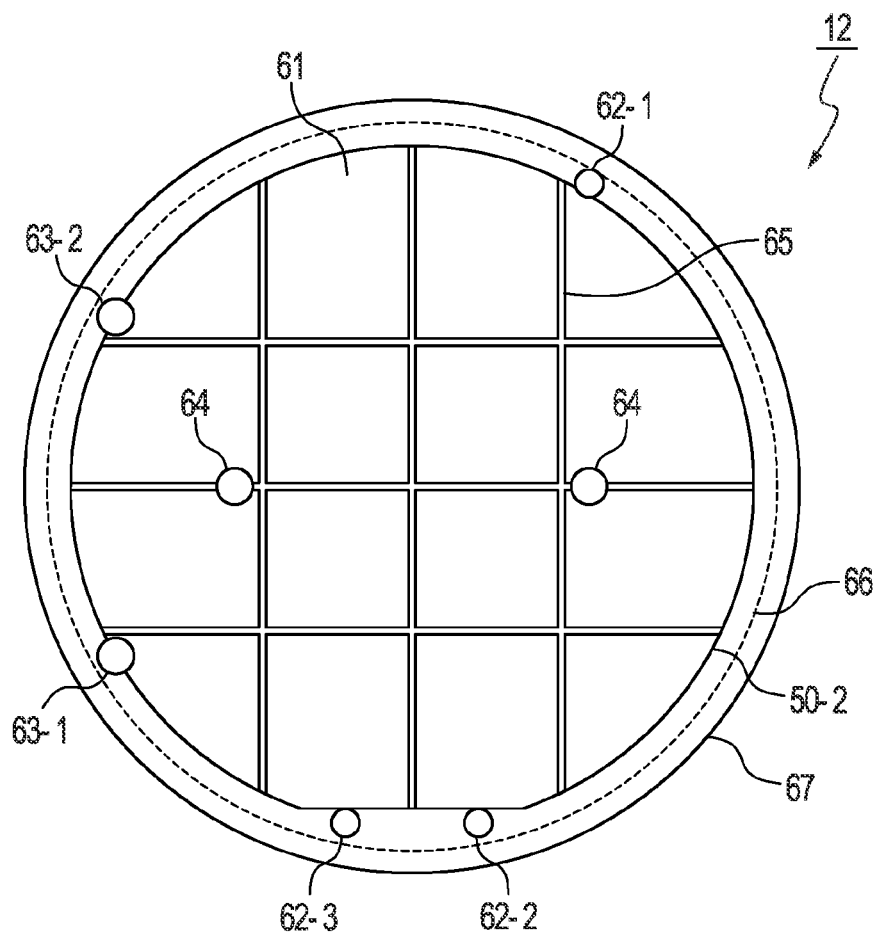
FIG. 9 is a plan view showing a lower-side cartridge.

FIG. 9 shows the lower-side cartridge 12. The lower-side cartridge 12 is formed of aluminum, is formed substantially in a disk and is used to put the lower-side wafer. In the lower-side cartridge 12, a plurality of positioning holes 63-1 and 63-2 and a plurality of alignment holes 64 are formed. The plurality of positioning holes 63-1 and 63-2 are circular and are formed in the neighborhood of the peripheral section of the disk. The diameter of the plurality of positioning holes 63-1 and 63-2 is substantially equal to the diameter of the positioning pin 48-1 and 48-2 of the stage carriage 45. Moreover, the plurality of positioning holes 63-1 and 63-2 are formed such that a distance between the positioning hole 63-1 and the positioning hole 63-2 is equal to a distance between the positioning pin 48-1 and the positioning pin 48-2. That is, the plurality of positioning holes 63-1 and 63-2 are fit with the plurality of positioning pin 48-1 and 48-2 when the lower-side cartridge 12 is put on the stage carriage 45. That is, the lower-side cartridge 12 is put on a predetermined position of the stage carriage 45 when the lower-side cartridge 12 is put on the stage carriage 45 so that the plurality of positioning pins 48-1 and 48-2 engage with the plurality of positioning holes 63-1 and 63-2.

A plurality of alignment holes 64 are formed to penetrate. The plurality of alignment holes 64 are connected with the plurality of alignment holes 47 of the stage carriage 45 when the lower-side cartridge 12 is put on the stage carriage 45. Moreover, the plurality of alignment holes 64 are formed to be coincident with an alignment mark which is formed on the lower-side wafer when the lower-side wafer is put on the lower-side cartridge 12. The two imaging units of the lower-side stage 42 are arranged to image the alignment mark through the plurality of alignment holes 64 when the lower-side cartridge 12 is put on the stage carriage 45.

Moreover, in the lower-side cartridge 12, the island portion 61 and the plurality of wafer positioning pins 62-1 to 62-3 are formed on the upper-side surface of the disk. The island portion 61 is formed as a prominence which protrudes from the upper-side surface of the disk, is formed to have almost the same shape as the lower-side wafer put on the lower-side cartridge 12. The upper surface of the island portion 61 forms one plane. In the island portion 61, ditches 65 are formed in the upper surface. The ditches 65 are formed in a grid array on the upper surface. Moreover, the ditches 65 are formed to be connected with the side surface of the island portion 61.

The plurality of wafer positioning pins 62-1 to 62-3 are formed as prominences which protrude from the upper-side surface of the disk and are formed to be arranged along the outer circumferential surface of the lower-side wafer 50-2 put on the lower-side cartridge 12. Especially, the wafer positioning pins 62-2 and 62-3 are formed to be arranged along the orientation flat of the lower-side wafer put on the lower-side cartridge 12. At this time, the lower-side wafer 50-2 is arranged on a predetermined position of the lower-side cartridge 12 so that the outer circumferential surface is brought into contact with the wafer positioning pin 62-1 and the orientation flat is brought into contact with the wafer positioning pins 62-2 and 62-3.

Moreover, the plurality of wafer positioning pins 62-1 to 62-3 are taller than the island portion 61, and are formed to be lower than the upper-side surface of the lower-side wafer put on the island portion 61. That is, the island portion 61 is formed to contact an almost portion of the surface of the lower-side wafer which is opposite to the lower-side cartridge 12 when the lower-side is put on the lower-side cartridge 12. The plurality of wafer positioning pins 62-1 to 62-3 are formed to contact the side surface of the lower-side wafer when the lower-side wafer is put on the lower-side cartridge 12. The plurality of wafer positioning pins 62-1 to 62-3 are formed not to protrude upwardly from the upper surface of the lower-side wafer when the lower-side wafer is put on the lower-side cartridge 12.

Figure 10:
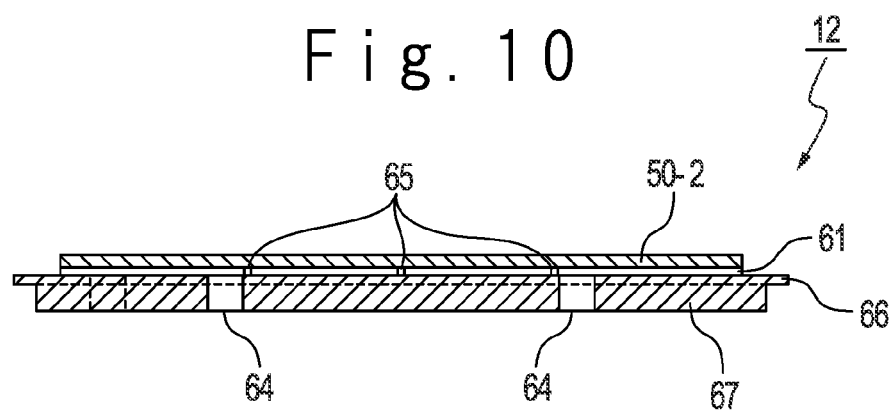
FIG. 10 is a vertical sectional view showing the lower-side cartridge.

As shown in FIG. 10, the lower-side cartridge 12 is formed from a flange section 66 and a body section 67. The body section 67 is formed in a column. The diameter of the column is smaller than a distance between the side edge 25-1 and the side edge 25-2. The flange portion 66 is formed to project from the side of the column of the body section 67 and is formed in a disk. The diameter of the disk is larger than the distance between the side edge 25-1 and the side edge 25-2. That is, because the flange section 66 is on the nail 21-1 and 21-2, the lower-side cartridge 12 is held by the conveyer unit 8.

Moreover, like the upper-side cartridge 11, the lower-side cartridge 12 is provided with positioning pins. The positioning pins are formed as prominences which protrude from the lower surface of the flange portion 66. The diameter of the positioning pins is substantially equal to the diameter of the notches 49-1 and 49-2. The two positioning pins are formed on two symmetrical positions with respect to the center of the disk of the flange portion 66. That is, the positioning pins are formed to engage with the notches 49-1 and 49-2 of the nails 21-1 and 21-2, respectively, when the lower-side cartridge 12 is held by the conveyer unit 8. At this time, when the lower-side cartridge 12 is held by the conveyer unit 8 to engage with the notches 49-1 and 49-2 of the nails 21-1 and 21-2, the lower-side cartridge 12 is held in the predetermined position of the hand 17.

A plurality of positioning pins similar to the plurality of positioning pins 48-1 and 48-2 are formed in the upper-side cartridge stage 6 and the lower-side cartridge stage 7, like the stage carriage 45. That is, the upper-side cartridge 11 is put on the predetermined position of the upper-side cartridge stage 6 when the upper-side cartridge 11 is arranged on the upper-side cartridge stage 6 such that the plurality of positioning pins of the upper-side cartridge stage 6 engage with the plurality of positioning holes 53-1 and 53-2. The lower-side cartridge 12 is put on the predetermined position of the lower-side cartridge stage 7 when the lower-side cartridge 12 is arranged on the lower-side cartridge stage 7 such that the plurality of positioning pins of the lower-side cartridge stage 7 engage with the plurality of positioning holes 63-1 and 63-2.

The room temperature bonding method according to the embodiment of the present invention is performed by using the room temperature bonding apparatus 1. An operator first closes the gate valve 5, generates a vacuum state in the internal space of the load lock chamber 3 by using the vacuum pump 31, and generates an atmospheric state in the internal space of the bonding chamber 2. The operator opens the lid of the load lock chamber 3 and arranges the upper-side cartridge 11 on the upper-side cartridge stage 6 and arranges the lower-side cartridge 12 on the lower-side cartridge stage 7. The operator puts the upper-side wafer on the upper-side cartridge 11 so that the orientation flat of the upper-side wafer contacts the wafer positioning pins 52-2 and 52-3 and the outer circumferential surface of the upper-side wafer contacts the wafer positioning pin 52-1. The operator puts the lower-side wafer 50-2 on the lower-side cartridge 12 such that the orientation flat of the lower-side wafer 50-2 contacts the wafer positioning pins 62-2 and 62-3 and the outer circumferential surface of the lower-side wafer 50-2 contacts the wafer positioning pin 62-1. Next, the operator closes the lid of the load lock chamber 3 and generates a vacuum state in the internal space of the load lock chamber 3.

Figure 11:
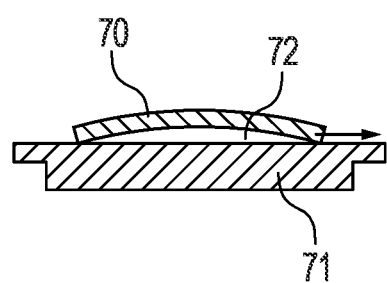
FIG. 11 is a vertical sectional view showing a state which the wafer is mounted on the cartridge.

As shown in FIG. 11, a wafer 70 exemplified as the upper-side wafer 50-1 or the lower-side wafer 50-2 is sometimes transformed. A space 72 is formed between the wafer 70 and the cartridge 71 when the wafer 70 is put on the cartridge 71 exemplified by the upper-side cartridge 11 or the lower-side cartridge 12. The air which is filled into the space 72 lifts the wafer 70 and sometimes moves the wafer 70 on the cartridge 71.

That is, the gas filled into the space between the upper-side cartridge 11 and the upper-side wafer 50-1 is exhausted to outside through the flow passage between the plurality of island portions 51-1 to 51-4. Such an exhaustion prevents the upper-side wafer 50-1 from being lifted by the gas between the upper-side cartridge 11 and the upper-side wafer 50-1 and prevents the upper-side wafer 50-1 from moving on the upper-side cartridge 11. Moreover, the gas filled into the space between the lower-side cartridge 12 and the lower-side wafer 50-2 is exhausted to outside through the ditches 65. Such an exhaustion prevents the gas between the lower-side cartridge 12 and the lower-side wafer 50-2 from lifting the lower-side wafer 50-2 and prevents the lower-side wafer 50-2 from moving on the lower-side cartridge 12 by The operator opens the gate valve 5 after the vacuum state is generated in the internal space of the load lock chamber 3. The operator holds the upper-side wafer 50-1 on the sample stage 43-1. FIG. 12 shows an operation of holding the upper-side wafer 50-1 on the sample stage 43-1. As shown in (a) of FIG. 12, the operator conveys the upper-side cartridge 11 with the upper-side wafer 50-1 put thereon from the upper-side cartridge stage 6 to the stage carriage 45 by the conveyer unit 8. The operator controls the hand 17 of the conveyer unit 8 to descend, as shown in (b) of FIG. 12. At this time, the plurality of positioning holes 53-1 and 53-2 are engaged with the plurality of positioning pins 48-1 and 48-2 of the stage carriage 45, respectively, and the upper-side cartridge 11 is held by the stage carriage 45.

The operator moves back the hand 17 of the conveyer unit 8 into the internal space of the load lock chamber 3, as shown in (c) of FIG. 12. Next, the operator descends the sample stage 43-1 downwardly in the vertical direction so that the dielectric layer of the sample stage 43-1 contacts the upper-side wafer 50-1 and the sample stage 43-1 holds the upper-side wafer 50-1. At this time, the plurality of wafer positioning pins 52-1 to 52-3 of the upper-side cartridge 11 are formed not to protrude from the upper-side wafer 50-1, and not to contact the sample stage 43-1. Therefore, the room temperature bonding apparatus 1 can contact the upper-side wafer 50-1 with the sample stage 43-1 more surely and can hold the sample stage 43-1 by the upper-side wafer 50-1 more surely. The operator raises the sample stage 43-1 upwardly in the vertical direction, as shown in (d) of FIG. 12 and separates the upper-side wafer 50-1 from the upper-side cartridge 11. The operator conveys the upper-side cartridge 11 on which the upper-side wafer 50-1 is not put, by using the conveyer unit 8 after the upper-side wafer 50-1 leaves the upper-side cartridge 11 from the stage carriage 45 to the upper-side cartridge stage 6.

The operator drives the stage carriage 45 to hold the lower-side wafer 50-2 after the sample stage 43-1 holds the upper-side wafer 50-1. FIG. 13 shows the operation to driving the stage carriage 45 to hold the lower-side wafer 50-2. The operator conveys the lower-side cartridge 12 on which the lower-side wafer 50-2 is put, by using the conveyer unit 8 as shown in (a) of FIG. 13 from the lower-side cartridge stage 7 onto the stage carriage 45. The operator descends the hand 17 of the conveyer unit 8 as shown in (b) of FIG. 13. At this time, the plurality of positioning holes 63-1 and 63-2 are engaged with the plurality of positioning pins 48-1 and 48-2 of the stage carriage 45, respectively, and the lower-side cartridge 12 is held by the stage carriage 45. The operator moves back the hand 17 of the conveyer unit 8 in the internal space of the load lock chamber 3, as shown in (c) of FIG. 13.

The operator closes the gate valve 5 and performs the room temperature bonding of the upper-side wafer 50-1 held on the sample stage 43-1 and the lower-side wafer 50-2 held on the stage carriage 45. That is, the operator turns the ion gun 32 to a space between the upper-side wafer 50-1 and the lower-side wafer 50-2 in a state that the upper-side wafer 50-1 held by the sample stage 43-1 and the lower-side wafer 50-2 held by the stage carriage 45 and to emit particles. The particles are irradiated to the upper-side wafer 50-1, the lower-side wafer 50-2 and so on and remove an oxide films formed on the surfaces, and impurities adhered to the surfaces. The operator operates the pressure welding mechanism 43-2 to descend the sample stage 43-1 downwardly in the vertical direction for the upper-side wafer 50-1 and the lower-side wafer 50-2 to make close to each other. The operator operates the positioning mechanism of the stage carriage 45 to move the position of the lower-side wafer 50-2 held by the stage carriage 45 such that the upper-side wafer 50-1 and the lower-side wafer 50-2 are bonded in accordance with the design. The operator operates the pressure welding mechanism 43-2 of the sample stage 43-1 to descend the sample stage 43-1 downwardly in the vertical direction such that the upper-side wafer 50-1 contacts the lower-side wafer 50-2. The upper-side wafer 50-1 and the lower-side wafer 50-2 are bonded through the contact to produce one sheet of bonded substrate. At this time, because the plurality of wafer positioning pins 62-1 to 62-3 of the lower-side cartridge 12 are formed not to protrude from the lower-side wafer 50-2, the plurality of wafer positioning pins 62-1 to 62-3 do not contact the sample stage 43-1 or the upper-side wafer 50-1. Therefore, the room temperature bonding apparatus 1 can contact the lower-side wafer 50-2 and the upper-side wafer 50-1 more surely and can bond the upper-side wafer 50-1 and the lower-side wafer 50-2 more surely. Moreover, at this time, the island portion 61 of the lower-side cartridge 12 contacts almost the whole of lower-side wafer 50-2. Therefore, that the lower-side wafer 50-2 is prevented from being damaged with load applied in the bonding and the room temperature bonding apparatus 1 can apply larger load on the upper-side wafer 50-1 and the lower-side wafer 50-2.

The operator ascends the sample stage 43-1 upwardly in the vertical direction after the bonding substrate is dechucked from the sample stage 43-1. Next, the operator opens the gate valve 5 and then uses the conveyer unit 8 to convey the lower-side cartridge 12 with a bonding substrate put from the stage carriage 45 to the lower-side cartridge stage 7. The operator closes the gate valve 5 and then generates an atmosphere state in the internal space of the load lock chamber 3. The operator opens the lid of the load lock chamber 3 and takes out the bonding substrate from the lower-side cartridge 12 arranged onto the lower-side cartridge stage 7.

According to such a room temperature bonding method, the upper-side wafer 50-1 and the lower-side wafer 50-2 are conveyed by the conveyer unit 8 without contacting the conveyer unit 8, and therefore, the pollution of the bonding surfaces can be prevented and the room temperature bonding can be made more surely. As a result, the reliability of the room temperature bonding apparatus 1 can be improved.

The transfer of the wafer between the stage for the room temperature bonding and the conveyer unit is generally performed by using lift pins which are arranged in the bonding chamber. According to such a room temperature bonding method, the room temperature bonding apparatus 1 is not required to have the lift pins, so that a manufacturing cost can be reduced and the maintenance operation can be also reduced. A drive system for driving a body generates a gas and pollutes the internal space of the chamber when it is arranged in the chamber. For this reason, in the room temperature bonding apparatus 1, the emitted gas can be reduced largely because such a drive system is not provided in the chamber and pollution of the wafer in the internal space can be prevented. As a result, the room temperature bonding apparatus 1 can bond them more surely in the room temperature while preventing the pollution of the bonding surfaces of the upper-side wafer 50-1 and the lower-side wafer 50-2, and the reliability is improved more.

The wafer trends to become large in diameter, and thin in thickness. At this time, there is a fear that the wafer is transformed, fallen, and damaged when it is directly held by the conveyer unit 8. According to such a room temperature bonding method, since the lower-side cartridge 12 is conveyed while the almost whole lower surface of the lower-side wafer 50-2 contacts the lower-side cartridge 12, transformation, falling and damage of the lower-side wafer 50-2 can are avoided. As a result, the room temperature bonding apparatus 1 can perform the room temperature bonding more surely and the reliability is improved.

It should be noted that the upper-side wafer with a special shape may be used in place of the wafer 50-1 in disk shape. At this time, the upper-side cartridge 11 can mount the upper-side wafer with the special shape so that the wafer does not move in reducing the pressure of the internal space. As a result, the room temperature bonding apparatus 1 prevents the pollution of the bonding surface of the wafer with the special shape and performs the room temperature bonding of the wafer more surely. The lower-side cartridge 12 may be made every shape of the wafer.

It should be noted that a lower-side wafer with a special shape may be used in place of the wafer 50-2. At this time, the lower-side cartridge 12 can mount the lower-side wafer with the special shape so that the wafer does not move in reducing the pressure of the internal space. As a result, the room temperature bonding apparatus 1 prevents the pollution of the bonding surface of the wafer with the special shape and performs the room temperature bonding of the wafer more surely. In the room temperature bonding apparatus, it is required to prepare the stage carriage 45 for every wafer type, and the apparatus can be produced cheaper.

It should be noted that the ditches 65 which are formed on the lower-side cartridge 12 may be not a grid shape but another different shape. As the different shape, a radial fashion shape is exemplified. It is desirable to provide many ditches 65 and form the ditches to be thicker, in order to improve the exhaustion efficiency of gas in the space between the lower-side cartridge 12 and the lower-side wafer 50-2. Moreover, it is desirable to form the ditches to be thinner and provide a small number of ditches 65, in order to prevent the transformation of the lower-side wafer 50-2 in bonding of the upper-side wafer 50-1, the lower-side wafer 50-2. Therefore, it is desirable that the shape of ditches 65 is designed in accordance with the attribute of the lower-side wafer 50-2.

The invention claimed is:

1. A room temperature bonding apparatus comprising:
a load lock chamber provided with a cartridge having a substrate put thereon and having an internal space which is pressure-reduced;
a bonding chamber comprising a lower-side stage, and an upper-side stage and a bonding mechanism, wherein said upper-side stage holds another substrate; and
a conveyer unit which conveys said cartridge having said substrate from said load lock chamber to said lower-side stage in said bonding chamber, when said bonding chamber is in a pressure-reduced state, such that said bonding mechanism bonds said substrate and said another substrate in said bonding chamber through a pressure welding process,
wherein said cartridge comprises a plurality of island portions and a flow passage extending between said plurality of island portions, each island portion having a flat surface, such that the plurality of island portions makes contact with substantially an entire surface of one side of said substrate when said substrate is put on said cartridge, and
wherein the flow passage connects a space between said cartridge and said substrate to an outside of said space when said substrate is put on said cartridge.

2. The room temperature bonding apparatus according to claim 1, wherein said cartridge has a flange, and said conveyer unit holds said cartridge by supporting a lower surface of said flange.

3. The room temperature bonding apparatus according to claim 2, wherein a hand positioning section is provided for said flange of said cartridge, and
wherein a hand of said conveyer unit has another hand positioning section configured to engage with said hand positioning section when said cartridge is conveyed.

4. The room temperature bonding apparatus according to claim 3, wherein said hand positioning section comprises a pin, and said another hand positioning section comprises a notch.

5. The room temperature bonding apparatus according to claim 1,
wherein said cartridge has a stage positioning section, and
wherein said lower-side stage has another stage positioning section configured to engage with said stage positioning section when said lower-side stage holds said cartridge.

6. The room temperature bonding apparatus according to claim 5, wherein said stage positioning section comprises holes, and said another stage positioning section comprises prominences configured to engage with said holes.

7. The room temperature bonding apparatus according to claim 5, further comprising:
an imaging unit; and
an alignment unit,
wherein an alignment hole is formed in said cartridge,
wherein said imaging unit takes an image of said substrate through said alignment hole when said lower-side stage holds said cartridge in a state that said substrate is put on said cartridge, and
wherein said alignment unit drives said lower-side stage based on said image.

8. The room temperature bonding apparatus according to claim 7, wherein said flow passage is a ditch formed in the island portion.

9. The room temperature bonding apparatus according to claim 1, wherein said cartridge has a plurality of substrate positioning pins, and
wherein said plurality of substrate positioning pins are arranged such that an outer circumferential edge of said substrate contacts all of said plurality of substrate positioning pins when said substrate is put on said cartridge.

10. The room temperature bonding apparatus according to claim 9, wherein a top surface of each of said plurality of substrate positioning pins has a height longer than a lower surface of said substrate and shorter than an upper surface of said substrate, when said substrate is put on said cartridge, said upper surface being a surface opposite to the lower surface.

11. The room temperature bonding apparatus according to claim 1, wherein said island portion contacts a peripheral portion of the surface on one side of said substrate.

\* \* \* \* \*